US012666764B2

(12) United States Patent \
Kang et al.

(10) Patent No.: US 12,666,764 B2 \
(45) Date of Patent: Jun. 23, 2026

(54) DISPLAY DEVICE USING SEMICONDUCTOR LIGHT EMITTING DEVICE WITH REDUCED SURFACE ADSORPTION DURING SELF-ASSEMBLY

(71) Applicant: LG ELECTRONICS INC., Seoul (KR)

(72) Inventors: Byungjun Kang, Seoul (KR); Junghoon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 838 days.

(21) Appl. No.: 17/759,631

(22) PCT Filed: Feb. 4, 2020

(86) PCT No.: PCT/KR2020/001601 \
§ 371 (c)(1), \
(2) Date: Jul. 28, 2022

(87) PCT Pub. No.: WO2021/153833 \
PCT Pub. Date: Aug. 5, 2021

(65) Prior Publication Data

US 2023/0081184 A1 Mar. 16, 2023

(30) Foreign Application Priority Data

Jan. 30, 2020 (KR) ........................ 10-2020-0011274

(51) Int. Cl. \
*H10H 20/84* (2025.01) \
*H10H 20/01* (2025.01) \
*H10W 90/00* (2026.01)

(52) U.S. Cl. \
CPC .......... *H10H 20/84* (2025.01); *H10H 20/018* (2025.01); *H10W 90/00* (2026.01); *H10H 20/034* (2025.01)

(58) Field of Classification Search \
CPC ................. H10H 20/84; H10H 20/034; H10H 20/852–854; H10H 29/02; H10H 20/01; H10H 20/019; H01L 2224/98 \
See application file for complete search history.

(56) References Cited

U.S. PATENT DOCUMENTS

2014/0353580 A1* 12/2014 Kang ................... H10H 20/825 \
257/13 \
2017/0365745 A1* 12/2017 Yang ...................... H10H 20/83 \
(Continued)

FOREIGN PATENT DOCUMENTS

JP 2007-123450 5/2007 \
JP 2009-200522 9/2009 \
(Continued)

OTHER PUBLICATIONS

European Patent Office Application Serial No. 20916323.7, Search Report dated Jan. 26, 2024, 8 pages. \
(Continued)

*Primary Examiner* — Christine S. Kim \
*Assistant Examiner* — Tyler J Wiegand \
(74) *Attorney, Agent, or Firm* — LEE, HONG, DEGERMAN, KANG & WAIMEY

(57) ABSTRACT

According to the present invention, in a display device comprising a substrate and semiconductor light emitting devices mounted on the substrate, the semiconductor light emitting devices are characterized in that the semiconductor light emitting devices include a protective layer and a pattern layer having one surface in contact with the protective layer, another surface in contact with the substrate, and a concave-convex structure on another surface, through such a structure, it is possible to minimize the phenomenon that the semiconductor light emitting device is adsorbed to the surface of the substrate other than the cell.

17 Claims, 15 Drawing Sheets

(56)          References Cited

U.S. PATENT DOCUMENTS

2019/0081025 A1*    3/2019  Chang ................. H01L 25/0753
2022/0367774 A1    11/2022  Kim et al.

FOREIGN PATENT DOCUMENTS

| KR | 10-1658838 | 10/2016 |
| KR | 2019-0029343 | 3/2019 |
| KR | 2019-0082691 | 7/2019 |
| KR | 2019-0106885 | 9/2019 |
| KR | 20190113695 | 10/2019 |

OTHER PUBLICATIONS

PCT International Application No. PCT/KR2020/001601, International Search Report dated Oct. 26, 2020, 5 pages.
Korean Intellectual Property Office Application No. 10-2020-0011274, Notice of Allowance dated Apr. 2, 2025, 7 pages.

\* cited by examiner

|Figure 1|
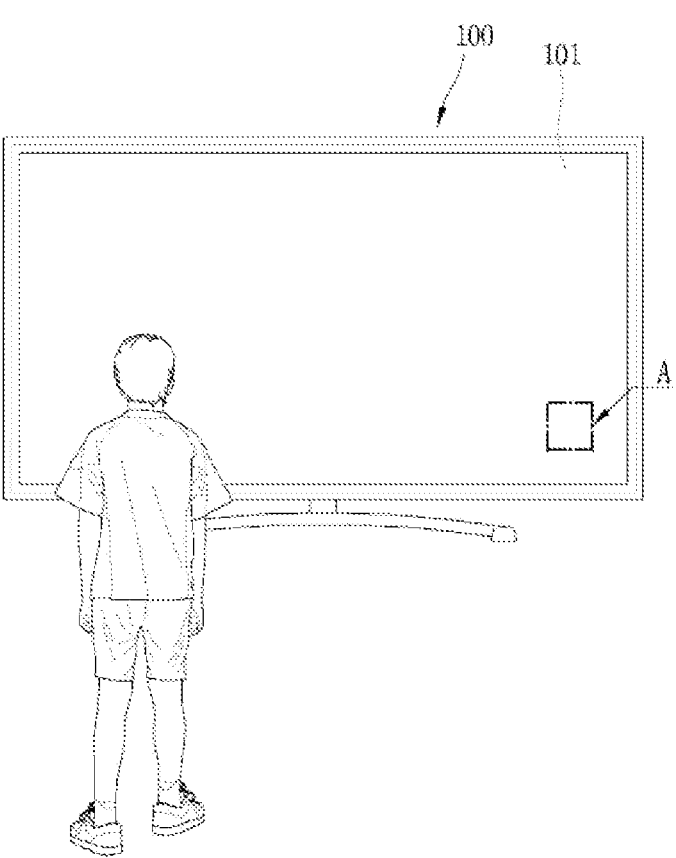

[Figure 2]
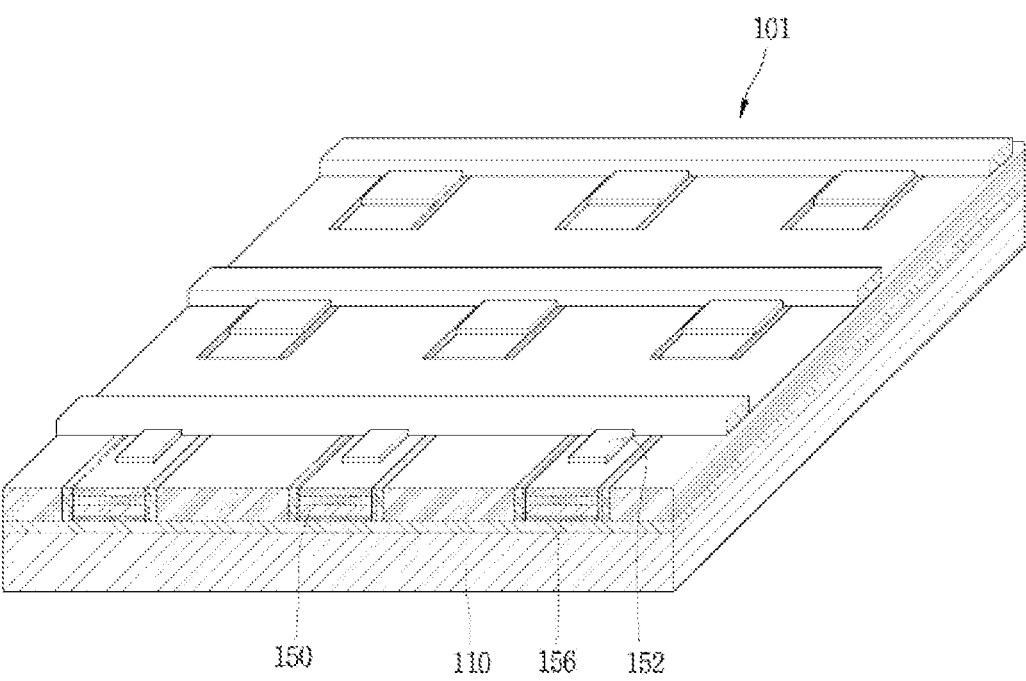
150    110  156   152
[Figure 3]
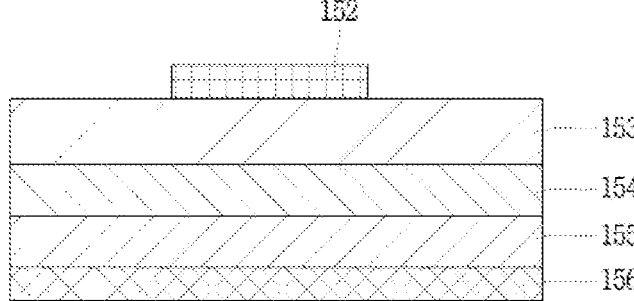
[Figure 4]
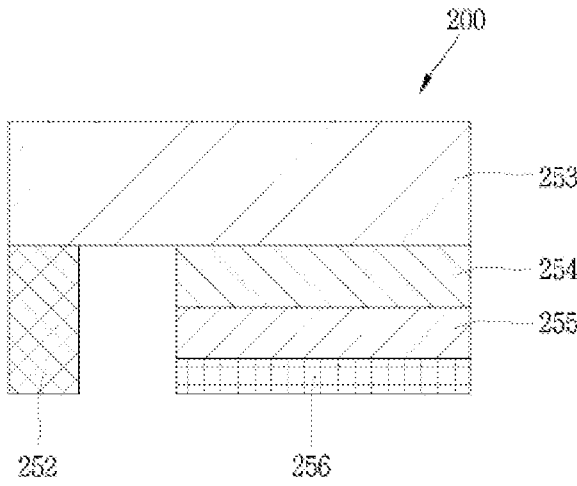

[Figure 5A]
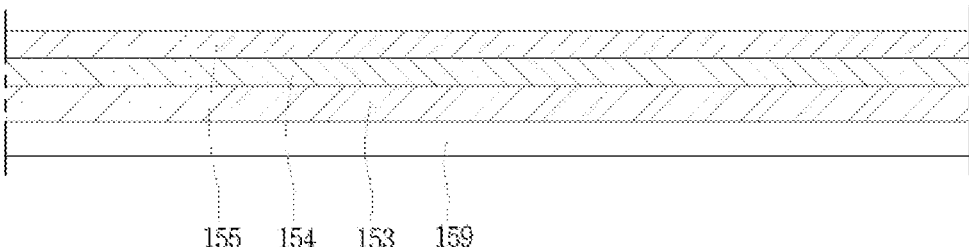
155　154　153　159
[Figure 5B]
155　154　153
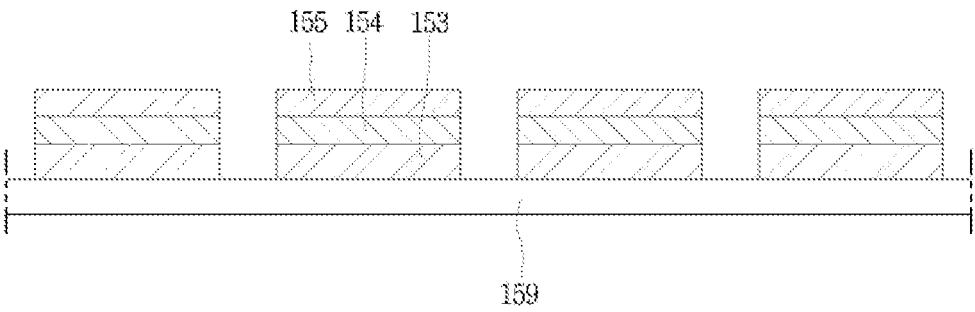
159
[Figure 5C]
156　　　155　154　153
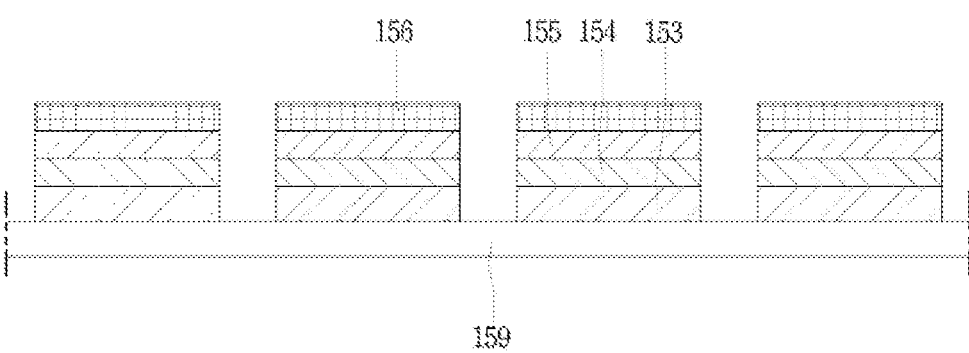
159
[Figure 5D]
150
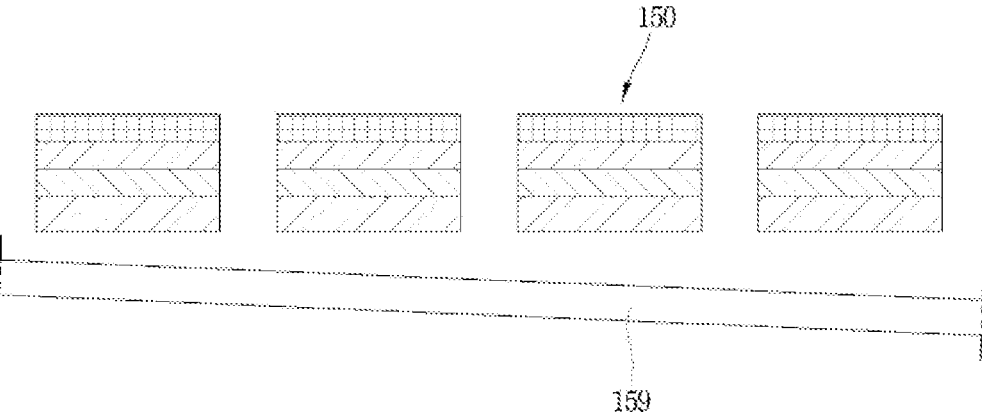
159

[Figure 5E]
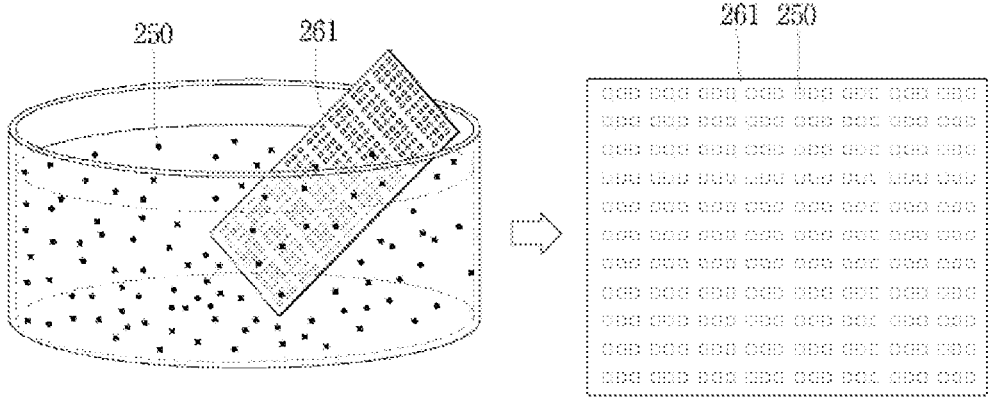
[Figure 6]
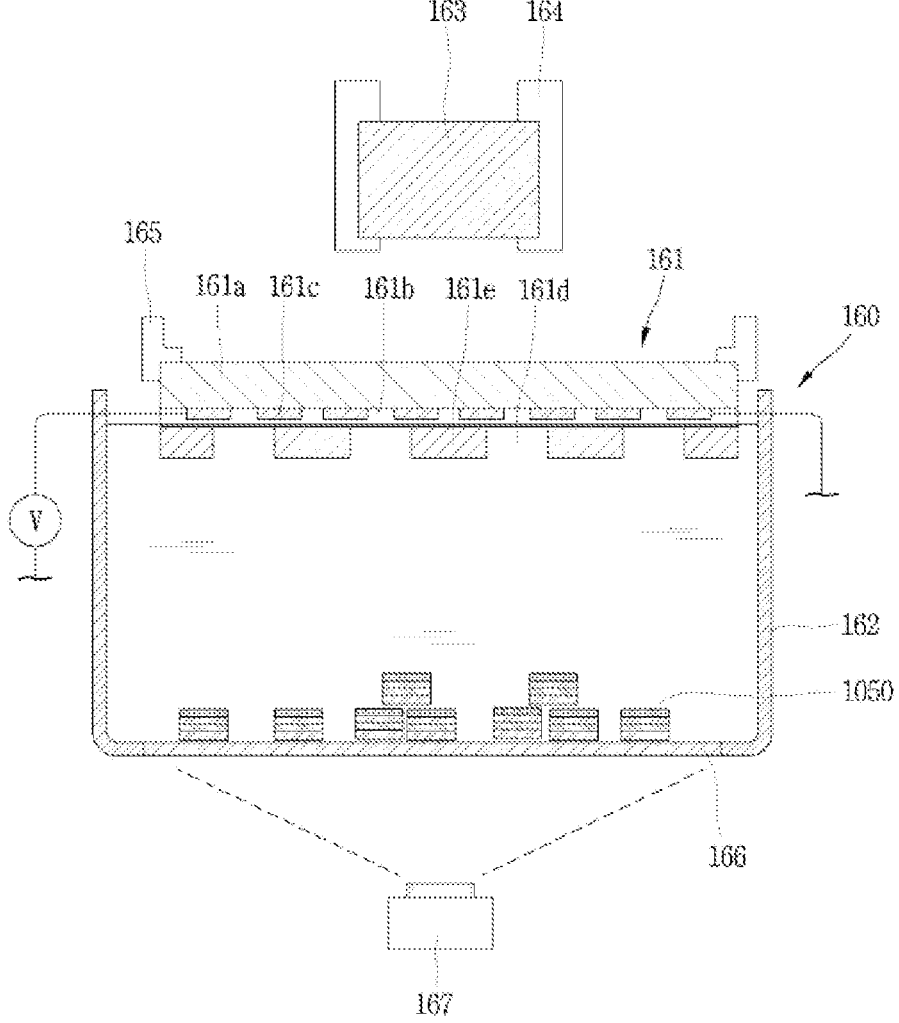

[Figure 7]
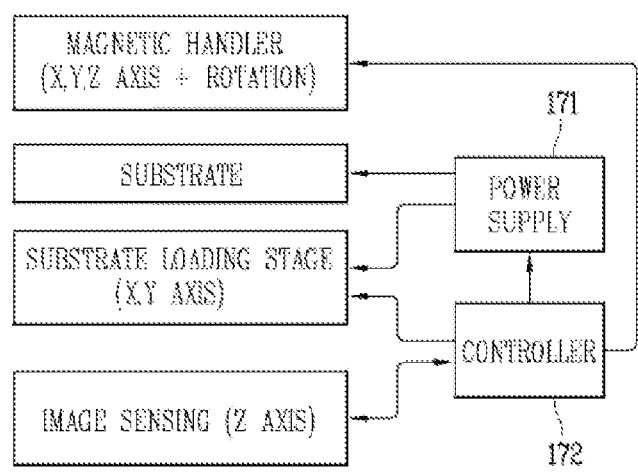
[Figure 8A]
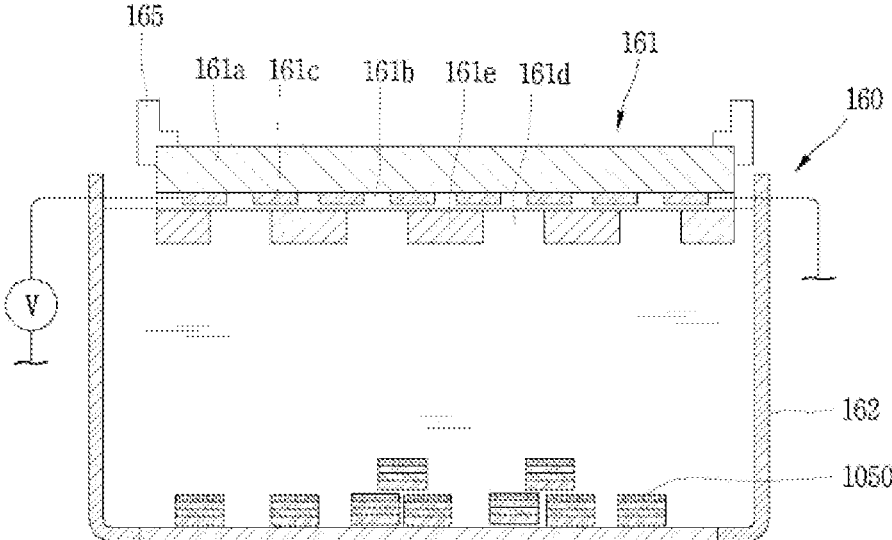

[Figure 8B]
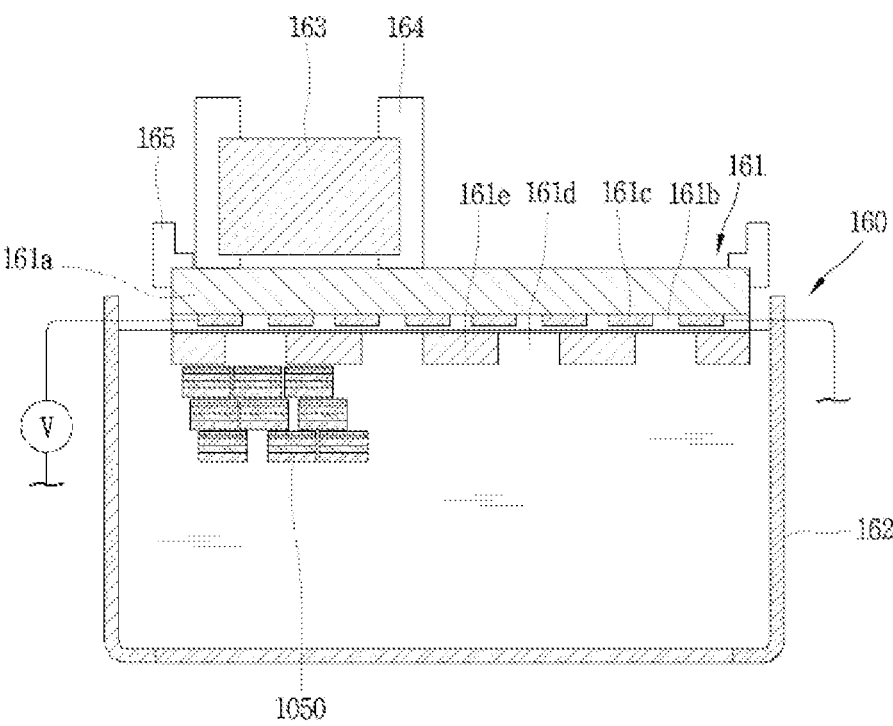
[Figure 8C]
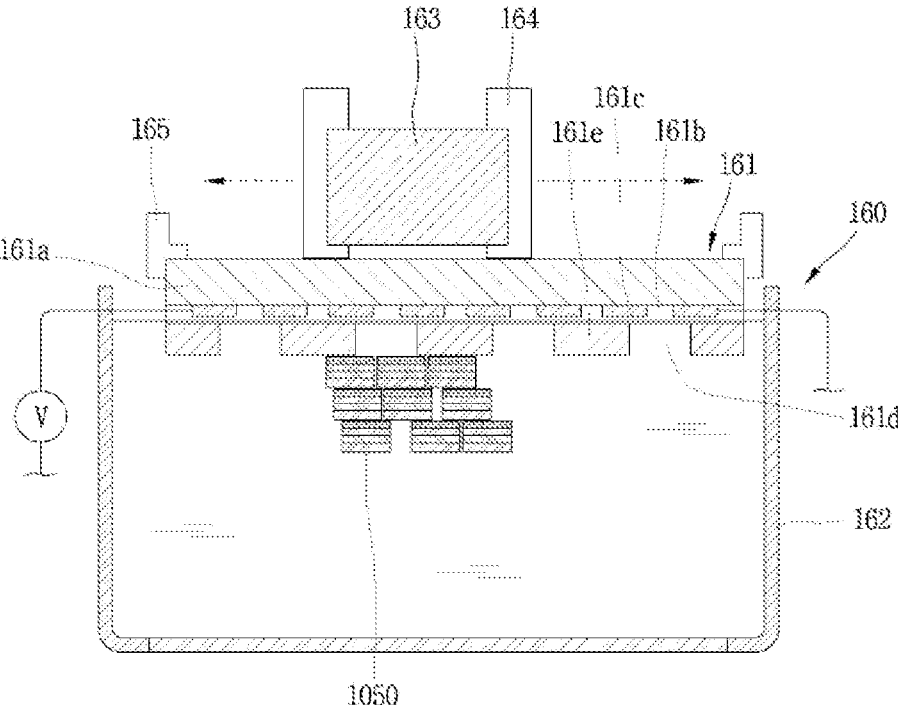

[Figure 8D]
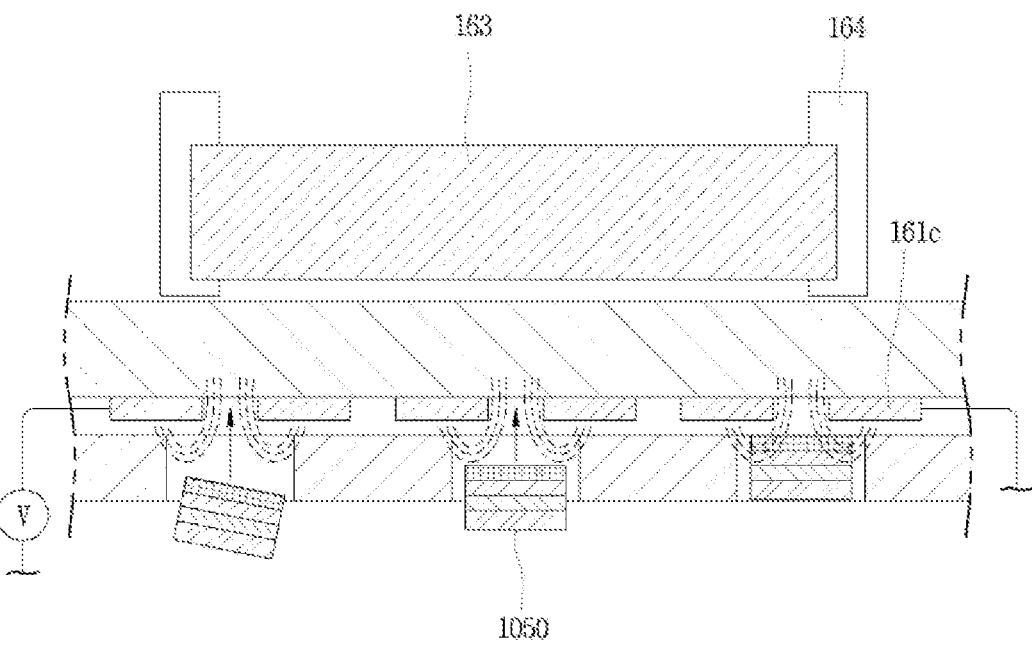
[Figure 8E]
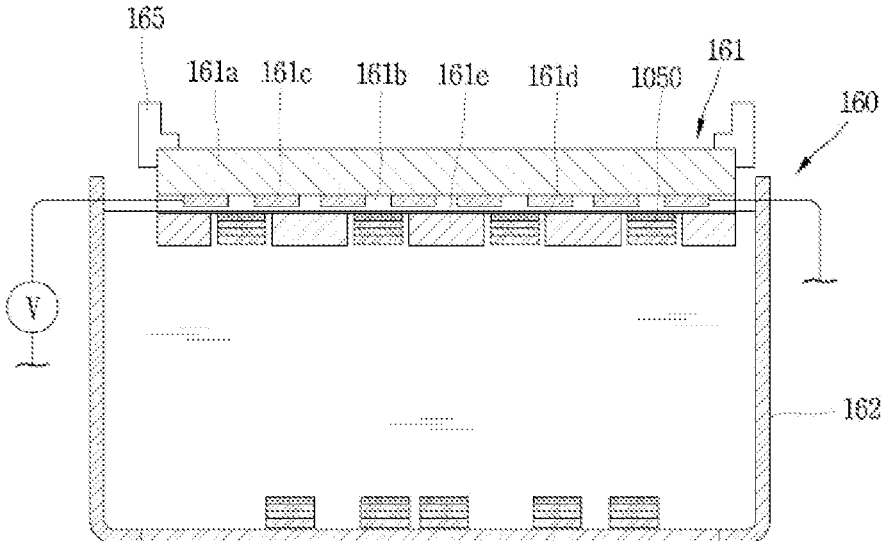

[Figure 9]
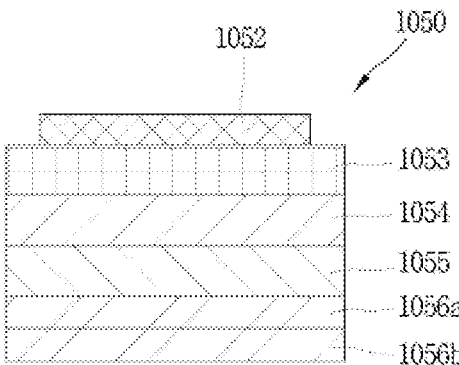

[Figure 10]

[Figure 11]
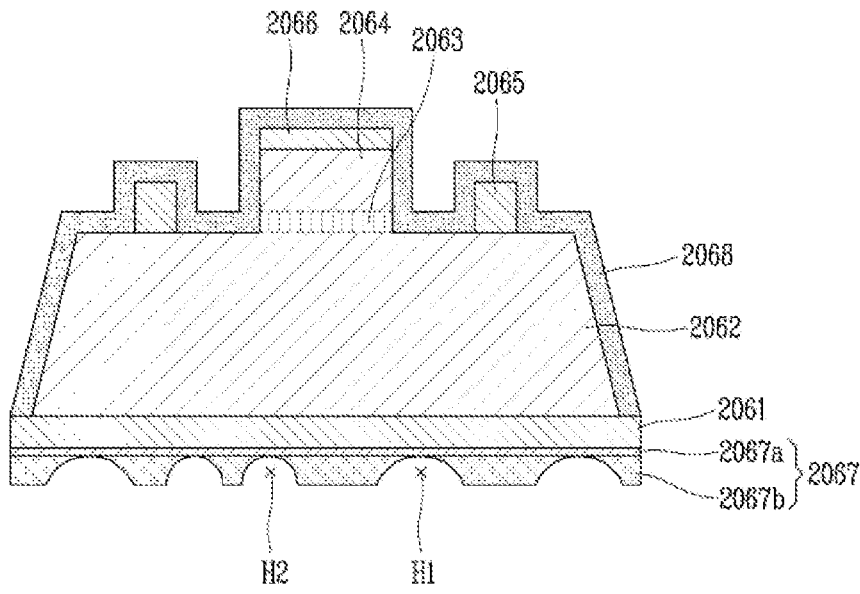
[Figure 12A]
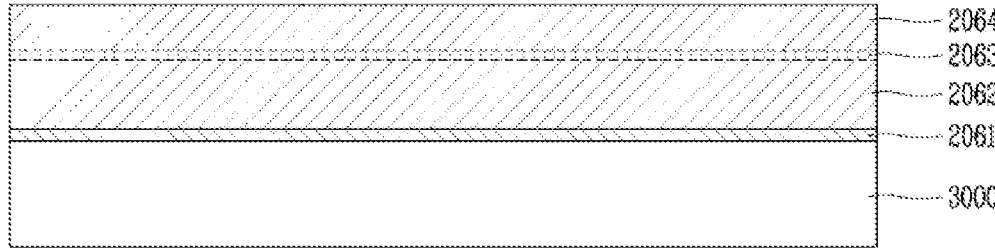
[Figure 12B]
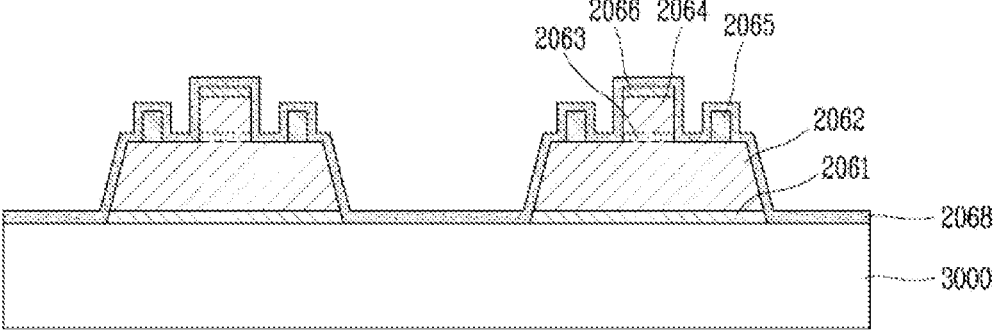

[Figure 12C]
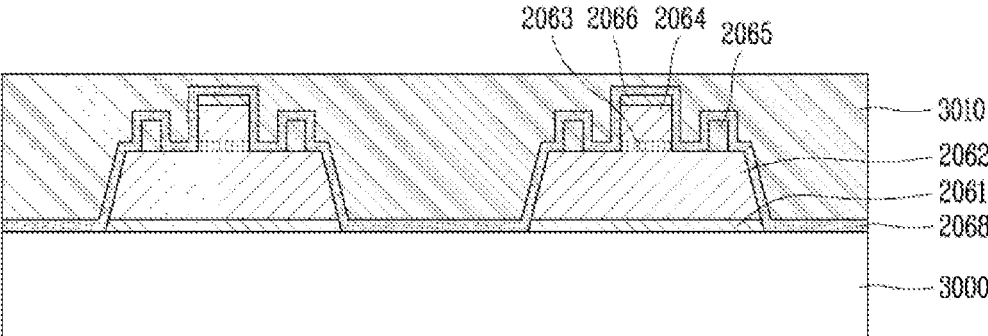
[Figure 12D]
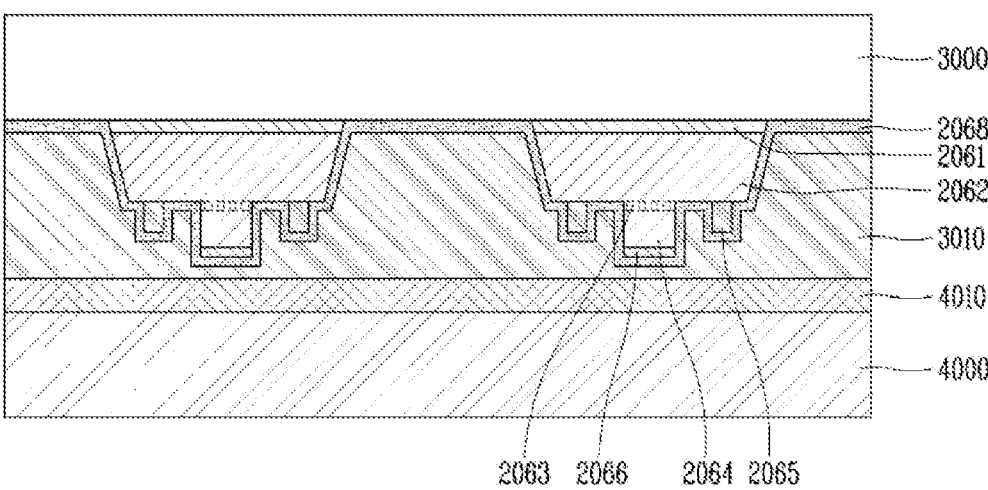
[Figure 12E]
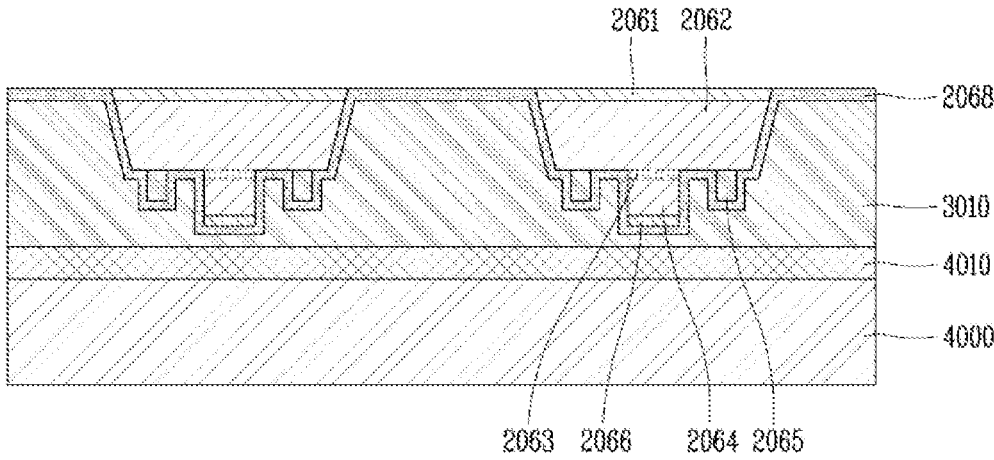

[Figure 12F]
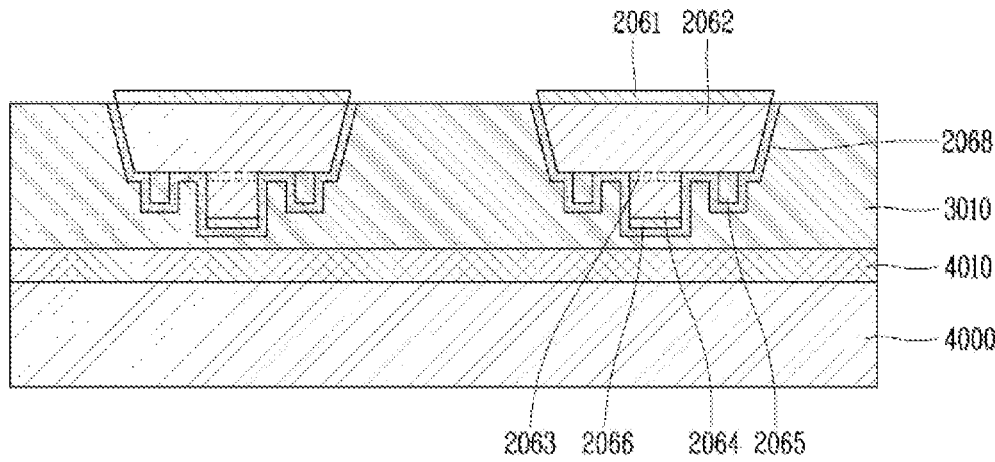
[Figure 12G]
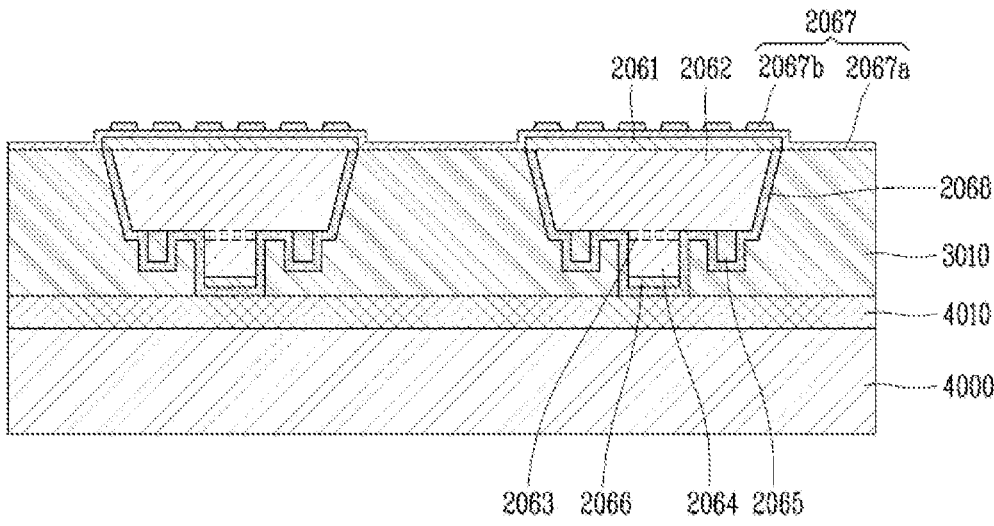

[Figure 12H]
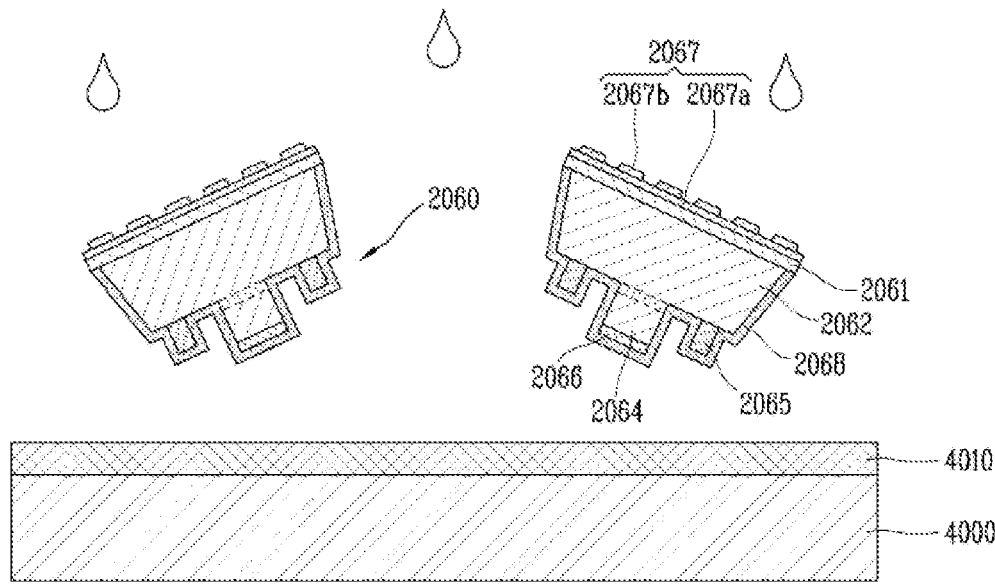
[Figure 13A]
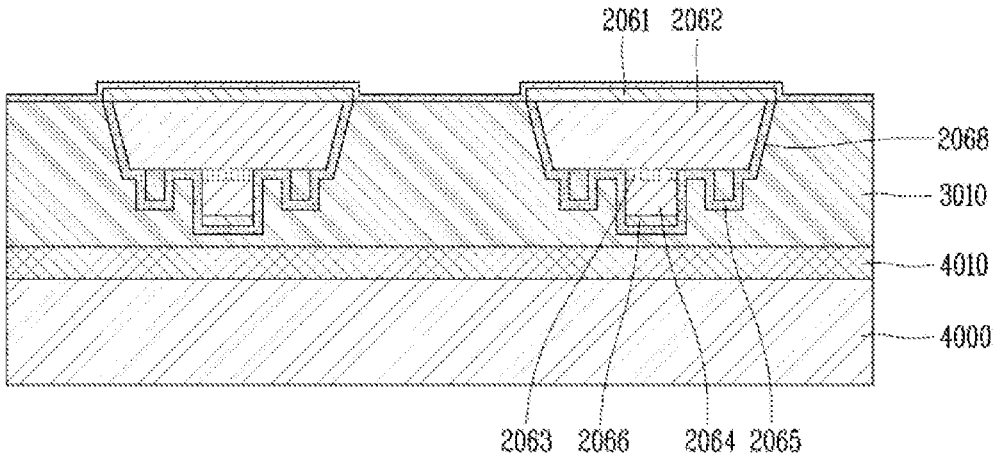

[Figure 13B]
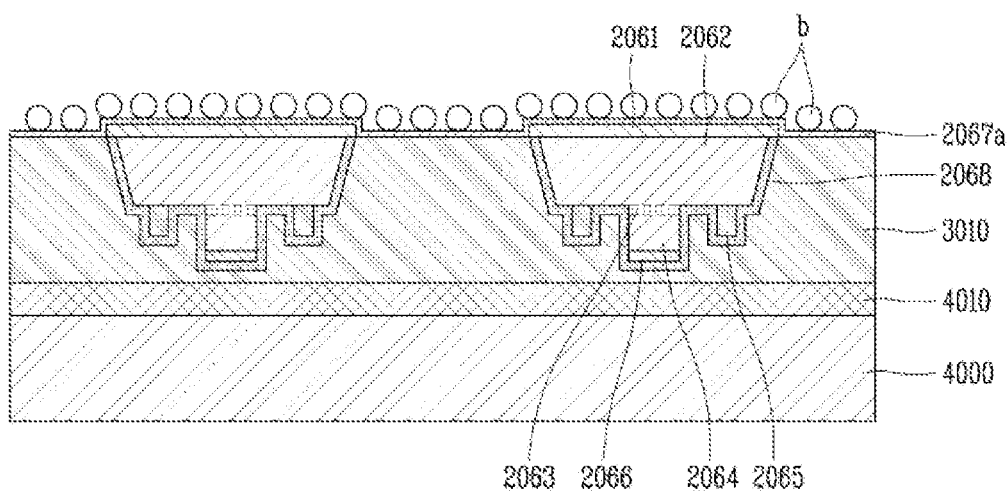
[Figure 13C]
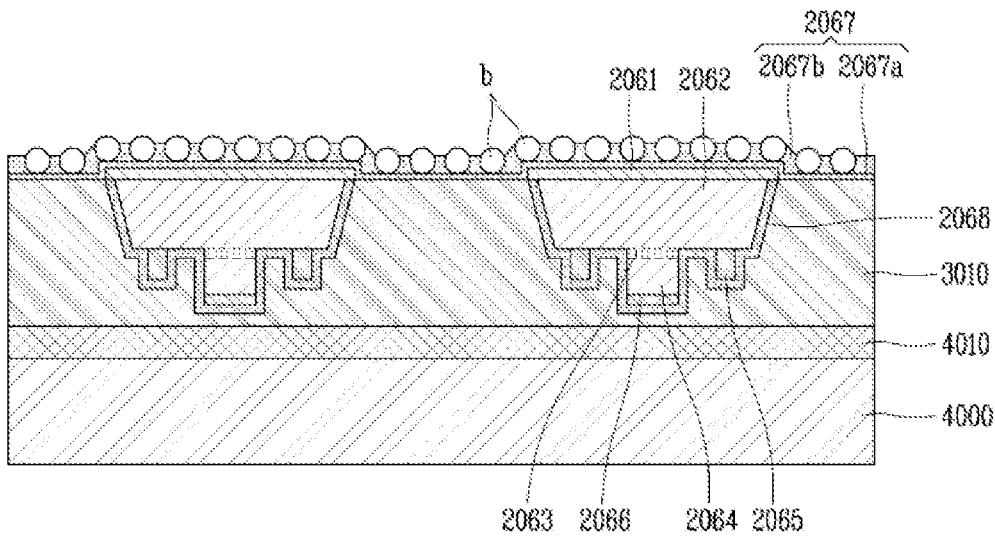

[Figure 13D]
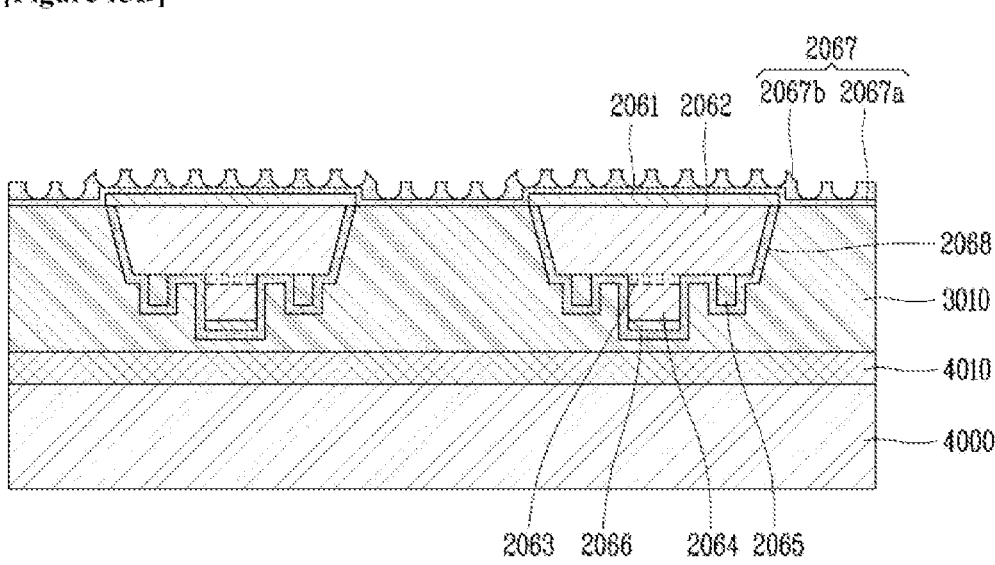

DISPLAY DEVICE USING SEMICONDUCTOR LIGHT EMITTING DEVICE WITH REDUCED SURFACE ADSORPTION DURING SELF-ASSEMBLY

CROSS-REFERENCE TO RELATED APPLICATION(S)

This application is the National Stage filing under 35 U.S.C. 371 of International Application No. PCT/KR2020/001601, filed on Feb. 4, 2020, which claims the benefit of earlier filing date and right of priority to Korean Application No. 10-2020-0011274, filed on Jan. 30, 2020, the contents of which are all hereby incorporated by reference herein in their entireties.

TECHNICAL FIELD

The present invention relates to a display device using a semiconductor light emitting device, and more particularly, to a display device using a semiconductor light emitting device having a size of several to several tens of μm.

BACKGROUND ART

Recently, liquid crystal displays (LCD), organic light emitting device (OLED) displays, and micro-LED displays are competing to implement large-area displays in the display technology field.

On the other hand, when a semiconductor light emitting device (micro-LED) having a diameter or cross-sectional area of 100 μm or less is used for a display, very high efficiency can be provided because the display does not absorb light using a polarizer or the like. However, since a large display requires millions of semiconductor light emitting devices, it is difficult to transfer the devices compared to other technologies.

Technologies that are currently being developed as a transfer process include pick & place, Laser Lift-off (LLO), or self-assembly. Among them, the self-assembly method is a method in which the semiconductor light emitting device finds its own position in a fluid, and is the most advantageous method for realizing a large screen display device.

The self-assembly method is a method of directly assembling the semiconductor light emitting device on the final substrate to be used in the product, and a method of assembling the semiconductor light emitting device on the assembly substrate and transferring the semiconductor light emitting device to the final substrate through an additional transfer process. The method of direct assembly to the final substrate is efficient in terms of process, and when using the assembly substrate, there is an advantage in that structures for self-assembly can be added without limitation, so the two methods are selectively used.

DISCLOSURE

Technical Problem

An object of the present invention is to provide a display device including a semiconductor light emitting device having a structure capable of minimizing a phenomenon in which the semiconductor light emitting device is adsorbed to a surface of a substrate other than a cell during self-assembly.

Technical Solution

According to the present invention, in a display device comprising a substrate and semiconductor light emitting devices mounted on the substrate, wherein the semiconductor light emitting devices comprise a protective layer; and a pattern layer that has one surface in contact with the protective layer, another surface in contact with the substrate, and a concave-convex structure on the other surface.

According to the present invention, the semiconductor light emitting devices are characterized in that the semiconductor light emitting devices include a first conductivity type semiconductor layer formed on the passivation layer; a first conductive electrode formed on the first conductivity type semiconductor layer; an active layer formed on the first conductivity type semiconductor layer; a second conductivity type semiconductor layer formed on the active layer; and a second conductive electrode formed on the second conductivity type semiconductor layer. The pattern layer is formed on a surface different from the surface on which the first conductivity type semiconductor layer is formed of the protective layer.

According to the present invention, the pattern layer is characterized in that the pattern layer includes a first layer formed to cover one surface of the protective layer; and a second layer formed on at least a partial region of the first layer.

According to the present invention, it is characterized in that the second layer includes a plurality of holes formed convexly toward the first layer.

According to the present invention, it is characterized in that the first and second layers are formed of any one of a metal, an alloy in which two or more metals are mixed, and a dielectric material.

According to the present invention, the method for manufacturing the above-described display device is characterized in that it includes (a) forming a plurality of semiconductor light emitting devices on a growth substrate; (b) sequentially forming a passivation layer and a sacrificial layer on the growth substrate to cover the plurality of semiconductor light emitting devices; (c) attaching a transfer substrate to which the plurality of semiconductor light emitting devices are to be transferred on the sacrificial layer, and then separating the growth substrate; and (d) forming a pattern layer on one surface of the plurality of semiconductor light emitting devices using a plurality of metal beads.

According to the present invention, it is characterized in that the plurality of semiconductor light emitting devices include a protective layer, and the pattern layer is formed on one surface of the protective layer.

According to the present invention, the step (d) is characterized in that it includes a step of forming a first layer on one surface of the plurality of semiconductor light emitting devices and one surface of the sacrificial layer; a step of coating the plurality of metal beads on the first layer; a step of forming a second layer in an area on the first layer where the plurality of metal beads are not coated; and a step of removing the plurality of metal beads.

According to the present invention, it is characterized in that the first layer and the second layer are formed by a deposition process.

According to the present invention, it is characterized in that the pattern layer includes the first layer and the second layer, and the second layer includes a plurality of holes convexly formed toward the first layer.

Advantageous Effects

Since the display device according to the present invention includes a semiconductor light emitting device including a pattern layer having a concave-convex structure, it is possible to minimize the phenomenon that the semiconductor light emitting device is adsorbed to the surface of a substrate other than a cell during self-assembly.

Also, since the display device according to the present invention includes a semiconductor light emitting device including a pattern layer having a concave-convex structure, a tailing phenomenon can be minimized and a magnet can be operated at a higher speed. Ultimately, it can contribute to improving self-assembly speed and reducing tact time.

DESCRIPTION OF DRAWINGS

FIG. 1 is a conceptual diagram illustrating an embodiment of a display device using a semiconductor light emitting device of the present invention.

FIG. 2 is a partially enlarged view of a portion A of the display device of FIG. 1.

FIG. 3 is an enlarged view of the semiconductor light emitting device of FIG. 2.

FIG. 4 is an enlarged view showing another embodiment of the semiconductor light emitting device of FIG. 2.

FIGS. 5A to 5E are conceptual views for explaining a new process for manufacturing the above-described semiconductor light emitting device.

FIG. 6 is a conceptual diagram showing an example of a self-assembly device of a semiconductor light emitting device according to the present invention.

FIG. 7 is a block diagram of the self-assembly device of FIG. 6.

FIGS. 8A to 8E are conceptual views illustrating a process of self-assembling a semiconductor light emitting device using the self-assembling device of FIG. 6.

FIG. 9 is a conceptual diagram for explaining the semiconductor light emitting device of FIGS. 8A to 8E.

FIG. 10 is a conceptual diagram of a display device including a semiconductor light emitting device according to the present invention.

FIG. 11 is a conceptual diagram of a semiconductor light emitting device according to the present invention.

FIGS. 12A to 12H are conceptual views illustrating a process of manufacturing a semiconductor light emitting device included in a display device according to the present invention.

FIGS. 13A to 13D are conceptual views illustrating a process of forming a pattern layer of a semiconductor light emitting device included in a display device according to the present invention.

MODE FOR INVENTION

Hereinafter, the embodiments disclosed in the present specification will be described in detail with reference to the attached drawings, but the same or similar components are given the same reference sign regardless of the reference numerals, and the redundant description thereof will be omitted. The suffixes "module" and "part" for components used in the following description are given or mixed in consideration of only the ease of writing the specification, and do not have a meaning or role distinct from each other by themselves. Also, in describing the embodiments disclosed in the present specification, if it is determined that detailed descriptions of related known technologies can obscure the gist of the embodiments disclosed in the present specification, the detailed description thereof will be omitted. Also, the attached drawings are only for easy understanding of the embodiments disclosed in the present specification, and should not be construed as limiting the technical idea disclosed herein by the attached drawings. Also, when an element such as a layer, region or substrate is referred to as being "on" another component, it will be understood that this can be directly on other elements or intervening elements can exist in between.

A display device described in this specification can include a mobile phone, a smart phone, a laptop computer, a digital broadcasting terminal, a PDA (personal digital assistant), a PMP (portable multimedia player), a navigation, a slate PC, a tablet PC (tablet PC), an ultra-book, a digital TV, a desktop computer, etc. However, the configuration according to the embodiment described in this specification can be applied as long as it can include a display even in a new product form to be developed later.

FIG. 1 is a conceptual diagram showing an embodiment of a display device using a semiconductor light emitting device of the present invention, FIG. 2 is a partial enlarged view of part A of the display device of FIG. 1, FIG. 3 is an enlarged view of the semiconductor light emitting device of FIG. 2, FIG. 4 is an enlarged view illustrating another embodiment of the semiconductor light emitting device of FIG. 2.

As illustrated, information processed by the control unit of the display device 100 can be output from the display module 140. A closed-loop case 101 surrounding an edge of the display module can form a bezel of the display device.

The display module 140 can include a panel 141 on which an image is displayed, the panel 141 can include a micro-sized semiconductor light emitting device 150 and a wiring substrate 110 on which the semiconductor light emitting device 150 is mounted.

A wiring can be formed on the wiring substrate 110 to be connected to the n-type electrode 152 and the p-type electrode 156 of the semiconductor light emitting device 150. Through this, the semiconductor light emitting device 150 can be provided on the wiring substrate 110 as an individual pixel that emits light.

The image displayed on the panel 141 is visual information, and is implemented by independently controlling the light emission of sub-pixels arranged in a matrix form through the wiring.

In the present invention, a micro-LED (Light Emitting Diode) is exemplified as a type of the semiconductor light emitting device 150 that converts current into light. The micro-LED can be a light emitting diode formed in a small size of 100 micrometers or less. In the semiconductor light emitting device 150, blue, red, and green colors are respectively provided in the light emitting region, and a unit pixel can be implemented by a combination thereof. That is, the unit pixel means a minimum unit for implementing one color, and at least three micro-LEDs can be provided in the unit pixel.

More specifically, referring to FIG. 3, the semiconductor light emitting device 150 can have a vertical structure.

For example, the semiconductor light-emitting device 150 can be implemented as a high-output light-emitting device that emits various types of light, including blue, by mainly using gallium nitride (GaN) and adding indium (In) and/or aluminum (Al) together.

Such a vertical semiconductor light emitting device includes a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the lower p-type electrode 156 can be electrically connected to the p-electrode of the wiring substrate, and the upper n-type electrode 152 can be electrically connected to the n-electrode at the upper side of the semiconductor light emitting device. The vertical semiconductor light emitting device 150 has a great advantage in that it is possible to reduce the chip size because electrodes can be arranged up and down.

As another example, referring to FIG. 4, the semiconductor light emitting device can be a flip chip type light emitting device.

As an example, the semiconductor light emitting device 250 includes a p-type electrode 256, a p-type semiconductor layer 255 on which the p-type electrode 256 is formed, an active layer 254 formed on the p-type semiconductor layer 255, an n-type semiconductor layer 253 formed on the active layer 254, and an n-type electrode 252 spaced apart from the p-type electrode 256 in the horizontal direction on the n-type semiconductor layer 253. In this case, both the p-type electrode 256 and the n-type electrode 152 can be electrically connected to the p-electrode and the n-electrode of the wiring substrate under the semiconductor light emitting device.

The vertical semiconductor light emitting device and the horizontal semiconductor light emitting device can be a green semiconductor light emitting device, a blue semiconductor light emitting device, or a red semiconductor light emitting device, respectively. In the case of a green semiconductor light emitting device and a blue semiconductor light emitting device, gallium nitride (GaN) is mainly used, and indium (In) and/or aluminum (Al) are added together, so that it can be implemented as a high-output light emitting device emitting green or blue light. For this example, the semiconductor light emitting device can be a gallium nitride thin film formed in various layers such as n-Gan, p-Gan, AlGaN, InGan, etc. Specifically, the p-type semiconductor layer can be P-type GaN, and the n-type semiconductor layer can be N-type GaN. However, in the case of a red semiconductor light emitting device, the p-type semiconductor layer can be P-type GaAs, and the n-type semiconductor layer can be N-type GaAs.

Also, the p-type semiconductor layer can be P-type GaN doped with Mg on the p-electrode side, and the n-type semiconductor layer can be N-type GaN doped with Si on the n-electrode side. In this case, the above-described semiconductor light emitting devices can be semiconductor light emitting devices without an active layer.

On the other hand, referring to FIGS. 1 to 4, since the light emitting diode is very small, in the display panel, self-luminous unit pixels can be arranged in a high definition, through this, a high-definition display device can be implemented.

In the display device using the semiconductor light emitting device of the present invention described above, the semiconductor light emitting device grown on a wafer and formed through mesa and isolation is used as an individual pixel. In this case, the micro-sized semiconductor light emitting device 150 should be transferred to a pre-set position on the substrate of the display panel on the wafer. There is a pick and place method as such a transfer technology, but the success rate is low and a lot of time is required. As another example, there is a technique of transferring several devices at once using a stamp or a roll, but there is a limit to the yield, which is not suitable for a large screen display. The present invention proposes a new manufacturing method and manufacturing device of a display device that can solve these problems.

To this end, hereinafter, a new method of manufacturing a display device will be described. FIGS. 5A to 5E are conceptual views for explaining a new process of manufacturing the above-described semiconductor light emitting device.

In this specification, a display device using a passive matrix (PM) type semiconductor light emitting device is exemplified. However, the examples described below are also applicable to an active matrix (AM) type semiconductor light emitting device. Also, although a method of self-assembly a horizontal semiconductor light emitting device is exemplified, it is also applicable to a method of self-assembly a vertical semiconductor light emitting device.

First, according to the manufacturing method, the first conductivity type semiconductor layer 153, the active layer 154, and the second conductivity type semiconductor layer 155 are grown on the growth substrate 159, respectively (refer to FIG. 5A).

When the first conductivity type semiconductor layer 153 is grown, next, an active layer 154 is grown on the first conductivity type semiconductor layer 153, next, a second conductivity type semiconductor layer 155 is grown on the active layer 154. In this way, when the first conductivity type semiconductor layer 153, the active layer 154, and the second conductivity type semiconductor layer 155 are sequentially grown, as shown in FIG. 5A, the first conductivity type semiconductor layer 153, the active layer 154, and the second conductivity type semiconductor layer 155 form a stacked structure.

In this case, the first conductivity type semiconductor layer 153 can be a p-type semiconductor layer, and the second conductivity type semiconductor layer 155 can be an n-type semiconductor layer. However, the present invention is not necessarily limited thereto, and examples in which the first conductivity type is n-type and the second conductivity type is p-type are also possible.

Also, although the case in which the active layer is present is exemplified in this embodiment, a structure without the active layer is possible in some cases as described above. For this example, the p-type semiconductor layer can be P-type GaN doped with Mg, and the n-type semiconductor layer can be N-type GaN doped with Si on the n-electrode side.

The growth substrate 159 (wafer) can be formed of a material having a light-transmitting property, for example, any one of sapphire (Al2O3), GaN, ZnO, and AlO, but is not limited thereto. Also, the growth substrate 1059 can be formed of a material suitable for semiconductor material growth, a carrier wafer. Also, it can be formed of a material with excellent thermal conductivity, including a conductive substrate or an insulating substrate, for example, at least one of Si, GaAs, GaP, InP, Ga2O3 or a SiC substrate having higher thermal conductivity than a sapphire (Al2O3) substrate can be used.

Next, at least some of the first conductivity type semiconductor layer 153, the active layer 154, and the second conductivity type semiconductor layer 155 are removed to form a plurality of semiconductor light emitting devices (refer to FIG. 5B).

More specifically, isolation is performed so that a plurality of light emitting devices form a light emitting device array. That is, the first conductivity type semiconductor layer 153, the active layer 154, and the second conductivity type semiconductor layer 155 are vertically etched to form a plurality of semiconductor light emitting devices.

If a horizontal semiconductor light emitting device is formed, the active layer 154 and the second conductivity type semiconductor layer 155 are partially removed in the vertical direction, a mesa process in which the first conductivity type semiconductor layer 153 is exposed to the outside, and an isolation process in which the first conductivity type semiconductor layer is etched to form a plurality of semiconductor light emitting device arrays can be performed thereafter.

Next, second conductive electrodes 156 (or p-type electrodes) are respectively formed on one surface of the second conductivity type semiconductor layer 155 (refer to FIG. 5C). The second conductive electrode 156 can be formed by a deposition method such as sputtering, but the present invention is not limited thereto. However, when the first conductivity type semiconductor layer and the second conductivity type semiconductor layer are an n-type semiconductor layer and a p-type semiconductor layer, respectively, the second conductive electrode 156 can be an n-type electrode.

Next, the growth substrate 159 is removed to provide a plurality of semiconductor light emitting devices. For example, the growth substrate 1059 can be removed using a laser lift-off (LLO) method or a chemical lift-off (CLO) method (refer to FIG. 5D).

Thereafter, a step of settling the semiconductor light emitting devices 150 on a substrate in a chamber filled with a fluid is performed (refer to FIG. 5E).

For example, the semiconductor light emitting devices 150 and the substrate are put in a chamber filled with a fluid, and the semiconductor light emitting devices are self-assembled on the substrate 161 using flow, gravity, surface tension, and the like. In this case, the substrate can be the assembly substrate 161.

As another example, it is also possible to put a wiring substrate in a fluid chamber instead of the assembly substrate 161 so that the semiconductor light emitting devices 150 are directly disposed on the wiring substrate. In this case, the substrate can be a wiring substrate. However, for convenience of description, in the present invention, the substrate is provided as the assembly substrate 161 to exemplify that the semiconductor light emitting devices 1050 are mounted.

Cells (not shown) in which the semiconductor light emitting devices 150 are inserted can be provided in the assembly substrate 161 to facilitate mounting of the semiconductor light emitting devices 150 on the assembly substrate 161. Specifically, cells in which the semiconductor light emitting devices 150 are disposed are formed on the assembly substrate 161 at positions where the semiconductor light emitting devices 150 are aligned with the wiring electrodes. The semiconductor light emitting devices 150 are assembled to the cells while moving in the fluid.

After arranging a plurality of semiconductor light emitting devices on the assembly substrate 161, if the semiconductor light emitting devices of the assembly substrate 161 are transferred to a wiring substrate, large-area transfer is possible. Accordingly, the assembly substrate 161 can be referred to as a temporary substrate.

On the other hand, in order to apply the self-assembly method described above to the manufacture of a large-screen display, it is necessary to increase the transfer yield. The present invention proposes a method and device for minimizing the influence of gravity or frictional force and preventing non-specific binding in order to increase the transfer yield.

In this case, in the display device according to the present invention, a magnetic material is disposed on a semiconductor light emitting device to move the semiconductor light emitting device using magnetic force, and the semiconductor light emitting device is disposed at a pre-set position by using an electric field during the movement process. Hereinafter, such a transfer method and device will be described in more detail with the attached drawings.

FIG. 6 is a conceptual diagram illustrating an example of a self-assembly device for a semiconductor light emitting device according to the present invention, and FIG. 7 is a block diagram of the self-assembly device of FIG. 6. FIGS. 8A to 8D are conceptual views illustrating a process of self-assembly a semiconductor light emitting device using the self-assembly device of FIG. 6, and FIG. 9 is a conceptual diagram for explaining the semiconductor light emitting device of FIGS. 8A to 8D.

Referring to FIGS. 6 and 7, the self-assembly device 160 of the present invention can include a fluid chamber 162, a magnet 163, and a position control unit 164.

The fluid chamber 162 has a space for accommodating a plurality of semiconductor light emitting devices. The space can be filled with a fluid, and the fluid can include water as an assembly solution. Accordingly, the fluid chamber 162 can be a water tank and can be configured as an open type. However, the present invention is not limited thereto, and the fluid chamber 162 can be of a closed type in which space is a closed space.

In the fluid chamber 162, the substrate 161 can be disposed such that an assembly surface on which the semiconductor light emitting devices 150 are assembled faces downward. For example, the substrate 161 can be transferred to an assembly position by a transfer unit, and the transfer unit can include a stage 165 on which the substrate is mounted. The position of the stage 165 is adjusted by the controller, and through this, the substrate 161 can be transferred to the assembly position.

At this time, the assembly surface of the substrate 161 faces the bottom of the fluid chamber 150 in the assembly position. As shown, the assembly surface of the substrate 161 is arranged to be immersed in the fluid in the fluid chamber 162. Accordingly, the semiconductor light emitting device 150 moves to the assembly surface in the fluid.

The substrate 161 is an assembly substrate capable of forming the electric field, and can include a base part 161a, a dielectric layer 161b, and a plurality of electrodes 161c.

The base part 161a can be made of an insulating material, and the plurality of electrodes 161c can be thin film or thick film bi-planar electrodes patterned on one surface of the base part 161a. The electrode 161c can be formed of, for example, a stack of Ti/Cu/Ti, Ag paste, ITO, or the like.

The dielectric layer 161b can be made of an inorganic material such as $SiO_2$, $SiN_x$, SiON, $Al_2O_3$, $TiO_2$, $HfO_2$, or the like. Alternatively, the dielectric layer 161b can be formed of a single layer or a multi-layer as an organic insulator. The thickness of the dielectric layer 161b can be in the range of several tens of nm to several μm.

Furthermore, the substrate 161 according to the present invention includes a plurality of cells 161d partitioned by barrier wall. The cells 161d are sequentially arranged in one direction and can be made of a polymer material. Also, the barrier wall 161e forming the cells 161d are shared with the neighboring cells 161d. The barrier wall 161e protrudes from the base part 161a, and the cells 161d can be sequentially disposed along one direction by the barrier wall 161e. More specifically, the cells 161d can be sequentially arranged in the column and row directions, respectively, and can have a matrix structure.

Inside the cells 161d, as shown, a groove for accommodating the semiconductor light emitting device 150 is provided, and the groove can be a space defined by the barrier wall 161e. The shape of the groove can be the same as or similar to that of the semiconductor light emitting device. For example, when the semiconductor light emitting device has a rectangular shape, the groove can have a rectangular shape. Also, although not shown, when the semiconductor light emitting device has a circular shape, the grooves formed in the cells can have a circular shape. Furthermore, each of the cells is configured to accommodate a single semiconductor light emitting device. That is, one semiconductor light emitting device is accommodated in one cell.

Meanwhile, the plurality of electrodes 161c can include a plurality of electrode lines disposed at the bottom of each of the cells 161d, and the plurality of electrode lines can extend to adjacent cells.

The plurality of electrodes 161c are disposed below the cells 161d, and different polarities are applied to each other to generate an electric field in the cells 161d. To form the electric field, the dielectric layer can form the bottom of the cells 161d while covering the plurality of electrodes 161c with the dielectric layer. In this structure, when different polarities are applied to the pair of electrodes 161c under each of the cells 161d, an electric field can be formed, and the semiconductor light emitting device can be inserted into the cells 161d by the electric field.

In the assembly position, the electrodes of the substrate 161 are electrically connected to the power supply unit 171. The power supply unit 171 applies power to the plurality of electrodes to generate the electric field.

As shown, the self-assembly device can include a magnet 163 for applying a magnetic force to the semiconductor light emitting devices. The magnet 163 is spaced apart from the fluid chamber 162 to apply a magnetic force to the semiconductor light emitting devices 150. The magnet 163 can be disposed to face the opposite surface of the assembly surface of the substrate 161, and the position of the magnet is controlled by the position controller 164 connected to the magnet 163.

The semiconductor light emitting device 1050 can include a magnetic material to move in the fluid by the magnetic field of the magnet 163.

Referring to FIG. 9, a semiconductor light emitting device including a magnetic material can include a first conductive electrode 1052 and a second conductive electrode 1056, a first conductivity type semiconductor layer 1053 on which the first conductive electrode 1052 is disposed, a second conductivity type semiconductor layer 1055 overlapping the first conductivity type semiconductor layer 1052 and on which the second conductive electrode 1056 is disposed, and an active layer 1054 disposed between the first and second conductivity type semiconductor layers 1053 and 1055.

Here, the first conductivity type can be a p-type, and the second conductivity type can be configured as an n-type, and vice versa. Also, as described above, it can be a semiconductor light emitting device without the active layer.

Meanwhile, in the present invention, the first conductive electrode 1052 can be generated after the semiconductor light emitting device is assembled on the wiring substrate by self-assembly of the semiconductor light emitting device. Also, in the present invention, the second conductive electrode 1056 can include the magnetic material. The magnetic material can mean a magnetic metal. The magnetic material can be Ni, SmCo, or the like, and as another example, can include a material corresponding to at least one of Gd-based, La-based, or Mn-based materials.

The magnetic material can be provided on the second conductive electrode 1056 in the form of particles. Alternatively, in a conductive electrode including a magnetic material, one layer of the conductive electrode can be formed of a magnetic material. For this example, as shown in FIG. 9, the second conductive electrode 1056 of the semiconductor light emitting device 1050 can include a first layer 1056a and a second layer 1056b. Here, the first layer 1056a can include a magnetic material, and the second layer 1056b can include a metal material rather than a magnetic material.

As shown, in this example, the first layer 1056a including a magnetic material can be disposed to contact the second conductivity type semiconductor layer 1055. In this case, the first layer 1056a is disposed between the second layer 1056b and the second conductivity type semiconductor layer 1055. The second layer 1056b can be a contact metal connected to the second electrode of the wiring substrate. However, the present invention is not necessarily limited thereto, and the magnetic material can be disposed on one surface of the first conductivity type semiconductor layer.

Referring back to FIGS. 6 and 7, more specifically, the self-assembly device can include a magnet handler capable of automatically or manually moving the x, y, and z axes on the upper side of the fluid chamber, or a motor capable of rotating the magnet 163. The magnet handler and the motor can constitute the position control unit 164. Through this, the magnet 163 rotates in a horizontal direction, clockwise or counterclockwise direction with the substrate 161.

Meanwhile, a light-transmitting bottom plate 166 can be formed in the fluid chamber 162, and the semiconductor light emitting devices can be disposed between the bottom plate 166 and the substrate 161. An image sensor 167 can be disposed to face the bottom plate 166 to monitor the inside of the fluid chamber 162 through the bottom plate 166. The image sensor 167 is controlled by the controller 172 and can include an inverted type lens and a CCD to observe the assembly surface of the substrate 161.

The self-assembly device described above can be made to use a combination of a magnetic field and an electric field. Using this, the semiconductor light emitting devices can be mounted at a pre-set position on the substrate by the electric field while the semiconductor light emitting devices are moved by a change in the position of the magnet. Hereinafter, the assembly process using the self-assembly device described above will be described in more detail.

First, a plurality of semiconductor light emitting devices 1050 including a magnetic material are formed through the process described with reference to FIGS. 5A to 5C. In this case, in the process of forming the second conductive electrode of FIG. 5C, a magnetic material can be deposited on the semiconductor light emitting device.

Next, the substrate 161 is transferred to the assembly position, and the semiconductor light emitting devices 1050 are put into the fluid chamber 162 (refer to FIG. 8A).

As described above, the assembly position of the substrate 161 can be a position in which the assembly surface of the substrate 161 on which the semiconductor light emitting devices 1050 are assembled faces downward in the fluid chamber 162.

In this case, some of the semiconductor light emitting devices 1050 can sink to the bottom of the fluid chamber 162 and some can float in the fluid. When the light-transmitting bottom plate 166 is provided in the fluid chamber 162, some of the semiconductor light emitting devices 1050 can sink to the bottom plate 166.

Next, a magnetic force is applied to the semiconductor light emitting devices 1050 so that the semiconductor light emitting devices 1050 vertically float in the fluid chamber 162 (refer to FIG. 8B).

When the magnet 163 of the self-assembly device moves from its original position to the opposite surface of the assembly surface of the substrate 161, the semiconductor light emitting devices 1050 are raised in the fluid toward the substrate 161. The original position can be a position deviated from the fluid chamber 162. As another example, the magnet 163 can be configured as an electromagnet. In this case, electricity is supplied to the electromagnet to generate an initial magnetic force.

Meanwhile, in this example, if the magnitude of the magnetic force is adjusted, the separation distance between the assembly surface of the substrate 161 and the semiconductor light emitting devices 1050 can be controlled. For example, the separation distance is controlled using the weight, buoyancy, and magnetic force of the semiconductor light emitting devices 1050. The separation distance can be several millimeters to several tens of micrometers from the outermost surface of the substrate.

Next, a magnetic force is applied to the semiconductor light emitting devices 1050 so that the semiconductor light emitting devices 1050 move in one direction in the fluid chamber 162. For example, the magnet 163 moves in a direction parallel to the substrate, clockwise or counterclockwise (refer to FIG. 8C). In this case, the semiconductor light emitting devices 1050 move in a direction parallel to the substrate 161 at a position spaced apart from the substrate 161 by the magnetic force.

Next, in the process of moving the semiconductor light emitting devices 1050, a step of inducing the semiconductor light emitting devices 1050 to the pre-set position by applying an electric field so as to be disposed at a pre-set position of the substrate 161 is performed (refer to FIG. 8C). For example, while the semiconductor light emitting devices 1050 are moving in a direction horizontal to the substrate 161, and move in a direction perpendicular to the substrate 161 by the electric field and are disposed at a pre-set position on the substrate 161.

More specifically, power is supplied to the bi-planar electrode of the substrate 161 to generate an electric field, and by using this, assembly is induced only at a pre-set position. That is, by using the selectively generated electric field, the semiconductor light emitting devices 1050 are self-assembled at the assembly position of the substrate 161. To this end, cells in which the semiconductor light emitting devices 1050 are inserted can be provided on the substrate 161.

Thereafter, the unloading process of the substrate 161 proceeds, and the assembly process is completed. When the substrate 161 is an assembly substrate, a post-process for realizing a display device by transferring the semiconductor light emitting devices arranged as described above to a wiring substrate can be performed.

Meanwhile, after guiding the semiconductor light emitting devices 1050 to the pre-set position, the magnet 163 can be moved in a direction away from the substrate 161 so that the semiconductor light emitting devices 1050 remaining in the fluid chamber 162 fall to the bottom of the fluid chamber (refer to FIG. 8D). As another example, when power supply is stopped when the magnet 163 is an electromagnet, the semiconductor light emitting devices 1050 remaining in the fluid chamber 162 fall to the bottom of the fluid chamber 162.

Thereafter, when the semiconductor light emitting devices 1050 at the bottom of the fluid chamber 162 are recovered, the recovered semiconductor light emitting devices 1050 can be reused.

In order to increase assembly yield in fluidic assembly, the self-assembly device and method described use a magnetic field to focus distant components near a pre-set assembly site, and applies a separate electric field to the assembly site to selectively assemble components only at the assembly site. At this time, the assembly substrate is placed on the upper part of the water tank and the assembly surface is directed downward to minimize the effect of gravity due to the weight of the parts and prevent non-specific binding to eliminate defects. That is, to increase the transfer yield, the assembly substrate is placed on the upper part to minimize the influence of gravity or frictional force, and non-specific binding can be prevented.

As described above, according to the present invention having the above configuration, in a display device in which individual pixels are formed of semiconductor light emitting devices, a large number of semiconductor light emitting devices can be assembled at once.

As described above, according to the present invention, it is possible to pixelate a large amount of semiconductor light emitting devices on a small-sized wafer and then transfer them to a large-area substrate. Through this, it is possible to manufacture a large-area display device at a low cost.

Hereinafter, a display device using a semiconductor light emitting device and a manufacturing method thereof according to the present invention will be described with reference to the accompanying drawings.

The display device using the semiconductor light emitting device according to the present invention can be implemented in a passive matrix (PM) method or an active matrix (AM) method.

The display device 2000 according to the present invention can include a substrate and semiconductor light emitting devices 2060 having a size of several to several tens of μm that can be mounted on the substrate through self-assembly.

The display device 2000 according to the present invention can include only blue semiconductor light emitting devices or can include two or more semiconductor light emitting devices among blue, green, and red semiconductor light emitting devices. That is, the structure of the semiconductor light emitting device 2060 described below can be applied to all of blue, green, and red semiconductor light emitting devices, and in particular, it is meaningful in that it can be applied to red semiconductor light emitting devices.

Figure 10:
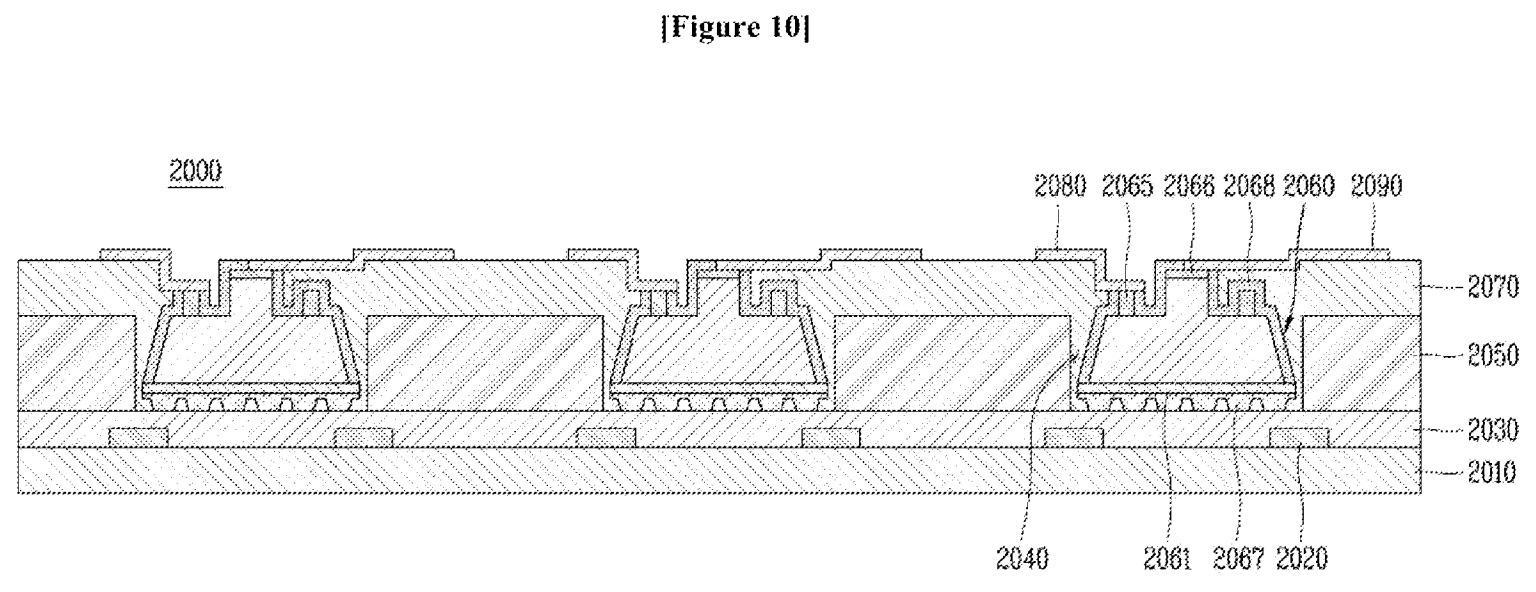

First, a structure of a display device including a semiconductor light emitting device according to the present invention will be described with reference to FIG. 10.

FIG. 10 is a conceptual diagram of a display device including a semiconductor light emitting device according to the present invention.

The display device 2000 according to the present invention can have an assembly electrode 2020, a dielectric layer 2030, semiconductor light emitting devices 2060 assembled in a cell 2040, and a barrier wall 2050, a planarization layer 2070, and wiring electrodes 2080 and 2090 formed on a base part 2010.

The base part 2010 can be a rigid substrate or preferably a flexible substrate. The base part 2010 can include a flexible and insulating polymer material for flexible implementation, and can include, for example, PI, PEN, PET, or the like.

On the base part 2010, the assembly electrodes 2020 extending in one direction can be formed in a plurality of rows. A voltage for forming an electric field inducing the semiconductor light emitting device 2060 can be applied to the assembly electrode 2020. Therefore, the assembly electrode 2020 can be formed of a non-resistive metal such as Al, Mo, Cu, Ag, Ti, or an alloy made of two or more non-resistive metals. Also, the assembly electrode 2020 can be formed to a thickness of several tens to several hundreds of nm.

Also, a dielectric layer 2030 can be formed on the base part 2010 to cover the assembly electrode 2020. The dielectric layer 2030 can be formed of an inorganic insulating material such as $SiO_2$, $SiN_x$, SiON, $Al_2O_3$, $TiO_2$, $HfO_2$, or the like. However, materials forming the dielectric layer 2030 are not limited to the listed materials.

The barrier wall part 2060 can be stacked on the dielectric layer 2030 to form the cell 2040. The cell 2040 can be formed in a matrix arrangement. The semiconductor light emitting devices 2060 can be settled inside the cell 2040. The barrier wall part 2050 can be formed of an inorganic or organic insulating material.

Also, a planarization layer 2070 can be formed on the base part 2010 to cover the barrier wall part 2050 and the semiconductor light emitting devices 2060 settled in the cell 2040. The planarization layer 2070 can also be formed of an inorganic or organic insulating material.

Wire electrodes 2080 and 2090 electrically connected to the semiconductor light emitting devices 2060 can be formed on the planarization layer 2070. The wiring electrodes 2080 and 2090 can include a first wiring electrode 2080 connected to the first conductive electrode 2065 of the semiconductor light emitting device 2060 and a second wiring electrode 2090 connected to the second conductive electrode 2066.

For electrical connection between the semiconductor light emitting devices 2060 and the wiring electrodes 2080 and 2090, the planarization layer 2070 can include a portion exposing portions of the first conductive electrode 2065 and the second conductive electrode 2066 of the semiconductor light emitting device 2060. The first wiring electrode 2080 and the second wiring electrode 2090 can be formed to cover the exposed portions of the first conductive electrode 2065 and the second conductive electrode 2066 of the semiconductor light emitting device 2060, respectively.

Next, a semiconductor light emitting device 2060 included in the display device 2000 according to the present invention will be described with reference to FIG. 11.

FIG. 11 is a conceptual diagram of a semiconductor light emitting device according to the present invention.

The display device 2000 according to the present invention can include a horizontal type semiconductor light emitting device 2060 having the structure shown in FIG. 11.

According to the present invention, the semiconductor light emitting device 2060 can include a protective layer 2061, a first conductivity type semiconductor layer 2062 formed on the protective layer 2061, a first conductive electrode 2065 formed on the first conductivity type semiconductor layer 2062, an active layer 2063 formed on the first conductivity type semiconductor layer 2062, a second conductivity type semiconductor layer 2064 formed on the active layer 2063 and a second conductive electrode 2066 formed on the second conductivity type semiconductor layer 2064. Also, the semiconductor light emitting device 2060 can include a pattern layer 2067 on a surface different from the surface on which the first conductivity type semiconductor layer 2062 is formed of the protective layer 2061.

The first conductivity type semiconductor layer 2062 and the first conductive electrode 2065 can be an n-type semiconductor layer and an n-type electrode, respectively, the second conductivity type semiconductor layer 2064 and the second conductive electrode 2066 can be a p-type semiconductor layer and a p-type electrode, respectively. However, the present invention is not necessarily limited thereto, for examples, the first conductivity type can be a p-type and the second conductivity type can be a n-type.

In FIG. 11, the first conductive electrode 2065 can be an electrode for ohmic contact, and the second conductive electrode 2066 can be formed as a transparent electrode as a region in which light generated in the active layer 2063 is emitted. However, the present invention is not limited thereto, and when the active layer 2063 is formed to overlap the first conductive electrode 2065, an opposite embodiment is also possible.

Also, at least one of the first conductive electrode 2065 and the second conductive electrode 2066 can include a magnetic layer (not shown) so that the semiconductor light emitting device 2060 can be easily guided by a magnet during self-assembly. The magnetic layer 3012 can be a layer including a magnetic material (for example, Ni, Ti, etc.).

Also, the semiconductor light emitting device 2060 can include a passivation layer 2068 formed along a side surface of the semiconductor light emitting device 2060 and an upper surface on which the first and second conductive electrodes 2065 and 2066 are formed.

According to the present invention, the protective layer 2061 can be a layer for preventing the semiconductor light emitting device 2060 from being damaged in the process of separating the semiconductor light emitting device 2060 from the growth substrate when the semiconductor light emitting device 2060 is manufactured. In particular, the protective layer can be a layer for preventing the epi layer of the semiconductor light emitting device 2060 from being etched together when the growth substrate is separated by a wet etching method like the red semiconductor light emitting device 2060. For example, the protective layer 2061 can be an undoped semiconductor layer.

The pattern layer 2067 can have one surface in contact with the protective layer 2061 and another surface in contact with the substrate. Specifically, another surface of the pattern layer 2067 can be in contact with the dielectric layer 2030 forming the bottom surface of the cell 2040 in the substrate.

The pattern layer 2067 can include a concave-convex structure on another surface in contact with the substrate. Since the concave-convex structure can reduce the area of the semiconductor light emitting device 2060 in contact with the substrate, the concave-convex structure can minimize a Van der vaals force acting between the semiconductor light emitting device 2060 and the substrate surface, so the phenomenon of adsorption to the surface of the substrate other than the cell 2040 by the force during the movement of the semiconductor light emitting device 2060 during self-assembly can be minimized.

Some of the drawings attached to this specification show that the pattern layer 2067 includes a regular uneven structure (the shape, spacing, size/diameter, etc. of the unevenness are the same or almost similar), but according to a manufacturing method to be described later, the pattern layer 2067 can include an irregular concavo-convex structure as shown in FIG. 11.

The pattern layer 2067 can be formed of a plurality of layers. Specifically, the pattern layer 2067 can include a first layer 2067a formed to cover one surface of the protective layer 2061 and a second layer 2067b formed on at least a partial region of the first layer 2067a and the second layer 2067b can be a layer including an uneven structure.

The second layer 2067b can include a plurality of holes (for example, H1, H2) in the form of a reverse circle convexly formed toward the first layer 2067a as shown in FIG. 11 and can have a concave-convex structure as a whole by the plurality of holes. The plurality of holes can have different shapes and sizes/diameters, and spacing between the pluralities of holes can also be different. Also, some of the plurality of holes can include an island-shaped pattern.

The first layer 2067a and the second layer 2067b can be formed of a material capable of a deposition process. The first layer 2067a and the second layer 2067b can be formed of any one of a metal (for example, Al, Sn, W, Mo, Ti, Au, Zn, Ni, Fe, Cu, etc.), an alloy of two or more metals, and a dielectric material (for example, $SiO_2$, SiNx, ZnO, $Al_2O_3$, WOx, MoOx, $TiO_2$, NiO, CuOx, HfOx), and can be formed of the same or different materials.

The semiconductor light emitting device 2060 included in the display device 2000 according to the present invention includes a pattern layer 2067 having a concave-convex structure on the rear surface so that the semiconductor light emitting device 2060 can move only under the influence of magnetic force and electric field during self-assembly, accordingly, there is an effect that can minimize the phenomenon that the semiconductor light emitting device 2060 is adsorbed to the surface of the substrate other than the cell 2040.

Also, there is effect that the semiconductor light emitting device 2060 of the above structure can minimize a tailing phenomenon that occurs when moving by the magnet in the self-assembly process, thereby improving the moving speed of the magnet and thereby improving the self-assembly process speed and reducing tact time Next, a method of manufacturing the display device 2000 including the above-described semiconductor light emitting device 2060 will be described with reference to FIGS. 12 and 13.

In particular, hereinafter, a method of manufacturing the semiconductor light emitting device 2060, which is one configuration of the display device 2000, will be mainly described.

FIGS. 12A to 12H are conceptual views illustrating a process of manufacturing a semiconductor light emitting device included in the display device according to the present invention.

According to the present invention, in order to manufacture the semiconductor light emitting device 2060, a step of (a) forming a plurality of semiconductor light emitting devices 2060 on the growth substrate 3000 can be firstly performed (FIGS. 12A and 12B).

Specifically, a protective layer 2061, a first conductivity type semiconductor layer 2062, an active layer 2063, a second conductivity type semiconductor layer 2064 and a second conductive electrode 2066 are formed on the growth substrate 3000, after mesa etching up to a portion of the first conductivity type semiconductor layer 2062 to form a first conductive electrode 2065 on the first conductivity type semiconductor layer 2062, an isolation etching process can be performed until the bottom surface of the growth substrate 3000 is exposed. The semiconductor light emitting devices 2060 can be isolated from each other through isolation etching.

In this step, the growth substrate 3000 can be a sapphire substrate, a Si substrate, a SiC substrate, a GaP substrate, an InP substrate, or a GaAs substrate, but is not limited thereto.

Also, the protective layer 2061, the first conductivity type semiconductor layer 2062, and the second conductivity type semiconductor layer 2064 can be formed by mainly using GaN and adding In and/or Al together. In particular, the first conductivity type semiconductor layer 2062 and the second conductivity type semiconductor layer 2064 can be doped with an n-type or p-type dopant, respectively. As described above, when the semiconductor layer is mainly formed of GaN, the semiconductor light emitting device 2060 can emit green or blue light.

Alternatively, the protective layer 2061, the first conductivity type semiconductor layer 2062, and the second conductivity type semiconductor layer 2064 can be formed by adding Al together mainly with GaInP, in this case, the semiconductor light emitting device 3000 can emit red light. In this specification, a manufacturing method in which a GaInP-based semiconductor layer is grown on a GaAs substrate will be described.

The above-described mesa and isolation steps can be performed by dry etching, for example, after forming a PR mask pattern, etching can be performed using $BCl_3/Cl_2/Ar$ gas. Also, in the corresponding step, the plurality of semiconductor light emitting devices 2060 can be etched so that the side surfaces thereof have a predetermined inclination.

Next, a step of (b) sequentially forming a passivation layer 2068 and a sacrificial layer 3010 on the growth substrate 3000 to cover the plurality of semiconductor light emitting devices 2060 can be performed (refer to FIGS. 12B and 12C). For example, the sacrificial layer 3010 can be a layer in which PR is applied on a plurality of layers made of a metal, an adhesive, and an organic film.

Next, a step of (c) attaching the transfer substrate 4000 to which the plurality of semiconductor light emitting devices 2060 are to be transferred on the sacrificial layer 3010, and then separating the growth substrate 3000 can be performed (refer to FIGS. 12D to 12F).

In this step, the transfer substrate 4000 can be a wafer-type rigid substrate such as glass or quartz, or a flexible film-type flexible substrate including a polymer material. Also, an adhesive can be applied to the surface of the transfer substrate 4000, and the surface on which the adhesive is applied can be pressed to the sacrificial layer 3010 to attach the transfer substrate 4000 to the sacrificial layer 3010.

The growth substrate 3000 can be separated from the transfer substrate 4000 and the semiconductor light emitting devices 2060 by a chemical lift-off (CLO) method. Also, after the growth substrate 3000 is separated, the step of removing the passivation layer 2068 connecting the adjacent semiconductor light emitting devices 2060 to each other can be further performed.

Next, a step of (d) forming the pattern layer 2067 on one surface of the plurality of semiconductor light emitting devices 2060 using the plurality of metal beads b can be performed (refer to FIG. 12G). The pattern layer 2067 can include the first layer 2067a and the second layer 2067b as described above. Hereinafter, a process of forming the pattern layer 2067 will be described with reference to FIG. 13.

FIGS. 13A to 13D are conceptual views illustrating a process of forming a pattern layer of a semiconductor light emitting device included in a display device according to the present invention.

In this step, a step of forming the first layer 2067a on one surface of the plurality of semiconductor light emitting devices 2060 and one surface of the sacrificial layer 3010 can be firstly performed (refer to FIG. 13A). The first layer 2067a can be formed by a deposition process (for example, sputtering or evaporation).

Next, a step of coating or applying a plurality of metal beads b on the first layer 2067a can be performed (refer to FIG. 13B). The plurality of metal beads b can have a particle diameter of several nm. On the other hand, although the figure shows that a plurality of metal beads (b) are regularly distributed on the first layer 2067*a* through the coating process, metal beads can be applied by spin coating or the like and randomly distributed on the first layer 2067*a*. By this step, the first layer 2067*a* can include a region where the metal bead b is coated and a void region where the metal bead (b) is not coated.

Next, a step of forming a second layer 2067*b* in a region on the first layer 2067*a* on which the plurality of metal beads b is not coated can be performed (refer to FIG. 13C). The second layer 2067*b* can also be formed by a deposition process (for example, sputtering or evaporation).

The second layer 2067*b* is deposited on the entire surface of the first layer 2067*a*, but is not deposited on the coated region of the plurality of metal beads (b) among the regions of the first layer 2067*a*, the second layer 2067*b* can be formed on at least a partial region of the first layer 2067*a*.

Meanwhile, the first layer 2067*a* and the second layer 2067*b* can be formed of a material that can be deposited by a deposition process. Each of the first layer 2067*a* and the second layer 2067*b* can be formed of any one of a metal (for example, Al, Sn, W, Mo, Ti, Au, Zn, Ni, Fe, Cu, etc.), an alloy in which two or more metals are mixed, and a dielectric material (for example, $SiO_2$, SiNx, ZnO, $Al_2O_3$, WOx, MoOx, $TiO_2$, NiO, CuOx, HfOx), and can be formed of the same or different materials.

Next, the step of removing the plurality of metal beads (b) can be performed, accordingly, the pattern layer 2067 can be formed on one surface of the semiconductor light emitting device 2060 (refer to FIG. 13D). The plurality of metal beads b can be removed from the fluid using ultrasonic waves. In an embodiment, the step of removing the plurality of metal beads b, which will be described later, can be performed in a fluid together with the step of removing the sacrificial layer 3010.

Finally, the semiconductor light emitting devices 2060 can be separated from the transfer substrate 4000 by removing the sacrificial layer 3010 using an organic solvent (refer to FIG. 12H). Meanwhile, the pattern layer 2067 formed on one surface of the sacrificial layer 3010 can be removed together with the sacrificial layer 3010 or removed separately from the sacrificial layer 3010. The semiconductor light emitting devices 2060 separated from the transfer substrate 4000 can be put into a fluid chamber containing DI after cleaning with an organic solvent and assembled on the substrate through self-assembly.

On the other hand, in the case of the embodiment of the method of manufacturing the semiconductor light emitting devices emitting green or blue light, the above-described steps can be applied in the same manner to the process of forming the pattern layer, except for the step which is necessarily changed according to the change of some material/material and the change of the material/material.

The semiconductor light emitting devices 2060 manufactured by such a manufacturing method can include a protective layer 2061 and a pattern layer 2067 formed on one surface of the protective layer 2061 and including an irregular concave-convex structure. In particular, the second layer 2067*b* among the plurality of layers forming the pattern layer 2067 can be a layer including a concave-convex structure. Since the concave-convex structure is formed by using the nano-bead b as a mask, the concave-convex structure can be formed as a whole by the plurality of holes convexly formed toward the first layer 2067*a*.

There is an effect that the pattern layer 2067 can reduce the probability of erroneous assembly of the semiconductor light emitting device 2060 by weakening the force acting between the semiconductor light emitting device 2060 and the surface of the substrate during self-assembly and can minimize the tailing phenomenon when moving by a magnet in the self-assembly process.

The present invention described above is not limited to the configuration and method of the above-described embodiments, but all or part of each embodiment can be selectively combined so that various modifications can be made.

What is claimed is:

1. A display device comprising:
   a substrate; and
   a plurality of semiconductor light emitting devices mounted on the substrate,
   wherein each of the semiconductor light emitting devices comprises a protective layer and a pattern layer,
   wherein the pattern layer comprises a first layer and a second layer,
   wherein the first layer is positioned between the protective layer and the second layer and includes a first surface and a second surface, wherein the first surface of the first layer faces the protective layer and is in contact with the protective layer,
   wherein the second layer is shaped to define a concave-convex structure having a first surface and an opposing second surface, and
   wherein the first surface of the second layer is in contact with at least a partial region of the second surface of the first layer and the second surface of the second layer faces the substrate.

2. The display device according to claim 1, wherein each of the semiconductor light emitting devices comprises:
   a first conductivity type semiconductor layer formed on the protective layer;
   a first conductive electrode formed on the first conductivity type semiconductor layer;
   an active layer formed on the first conductivity type semiconductor layer;
   a second conductivity type semiconductor layer formed on the active layer; and
   a second conductive electrode formed on the second conductivity type semiconductor layer,
   wherein the pattern layer is formed on a surface different from a surface on which the first conductivity type semiconductor layer is formed on the protective layer.

3. The display device according to claim 1, wherein substrate comprises a dielectric layer, and the second surface of the second layer is in contact with the dielectric layer of the substrate.

4. The display device according to claim 3, wherein the second layer comprises a plurality of holes convexly formed toward the first layer.

5. The display device according to claim 4, wherein the concave-convex structure is formed by the plurality of holes toward the first layer.

6. The display device according to claim 4, wherein the plurality of holes of the second layer comprise holes having different diameters.

7. The display device according to claim 4, wherein the first layer is exposed by the plurality of holes.

8. The display device according to claim 4, wherein a spacing distance between the plurality of holes comprises an irregular spacing distance.

9. The display device according to claim 3, wherein the first layer and the second layer are formed of any one of a metal, an alloy in which two or more metals are mixed, and a dielectric material.

10. The display device according to claim 3, wherein a thickness of the second layer is greater than a thickness of the first layer.

11. The display device according to claim 1, wherein the first layer and the second layer are formed of any one of a metal, an alloy of two or more metals, and a dielectric material.

12. The display device according to claim 11, wherein the first layer is configured to cover one surface of the protective layer and the second layer is disposed on at least the partial region of the second surface of the first layer, wherein the protective layer is sized to not connect to adjacent semiconductor light emitting devices.

13. The display device according to claim 1, wherein the protective layer of each of the semiconductor light emitting devices is sized to not contact adjacent ones of the semiconductor light emitting devices.

14. The display device according to claim 1, wherein an entire portion of the first layer is positioned between the protective layer and the second layer.

15. The display device according to claim 1, wherein the first surface of the first layer is in contact with an entire side of the protective layer facing the first layer.

16. The display device according to claim 1, wherein the concave-convex structure includes a plurality of curves having respectively different radius of curvature.

17. The display device according to claim 1, wherein the concave-convex structure forms a plurality of gaps between the second surface of the second layer and a surface of the substrate facing the second layer, wherein each of the plurality of gaps is void of material.

\* \* \* \* \*